(12) United States Patent
Rinella et al.

(10) Patent No.: US 6,636,423 B2
(45) Date of Patent: Oct. 21, 2003

(54) COMPOSITE FINS FOR HEAT SINKS

(75) Inventors: Agostino C. Rinella, DuPont, WA (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/046,469

(22) Filed: Oct. 29, 2001

(65) Prior Publication Data

US 2003/0081383 A1 May 1, 2003

(51) Int. Cl.$^7$ ................................................. H05K 7/20
(52) U.S. Cl. ..................... 361/703; 29/890.03; 165/185; 257/722
(58) Field of Search ....................... 29/890.03, 890.046; 257/722; 174/16.3; 165/80.3, 185, 180–184; 361/687, 703, 704, 705, 717–719, 722, 697; 428/596, 597, 615

(56) References Cited

U.S. PATENT DOCUMENTS

| 4,246,892 | A | * | 1/1981 | Waiche ........................ 126/662 |
| 4,571,368 | A | * | 2/1986 | Fenoglio et al. ............. 428/654 |
| 4,984,626 | A | * | 1/1991 | Esformes |
| 5,533,257 | A | * | 7/1996 | Romero et al. .......... 29/890.03 |
| 5,791,406 | A | * | 8/1998 | Gonner et al. .............. 165/185 |
| 6,329,075 | B1 | * | 12/2001 | Nener et al. |
| 6,330,157 | B1 | * | 12/2001 | Bezama et al. ............. 361/704 |
| 6,377,453 | B1 | * | 4/2002 | Belady ........................ 361/687 |

\* cited by examiner

*Primary Examiner*—Gerald Tolin
(74) *Attorney, Agent, or Firm*—Schwegman, Lundberg, Woessner & Kluth, P.A.

(57) ABSTRACT

A heat sink that dissipates heat from an electronic device. The heat sink comprises a base and one or more fins. The base is copper and is thermally coupled to an integrated circuit that includes a high-powered processor. The fins each include a copper portion and an aluminum portion. The copper portion of the fin is thermally coupled to the base to conduct thermal energy away from the base. The remainder of the fin is formed from aluminum.

31 Claims, 5 Drawing Sheets

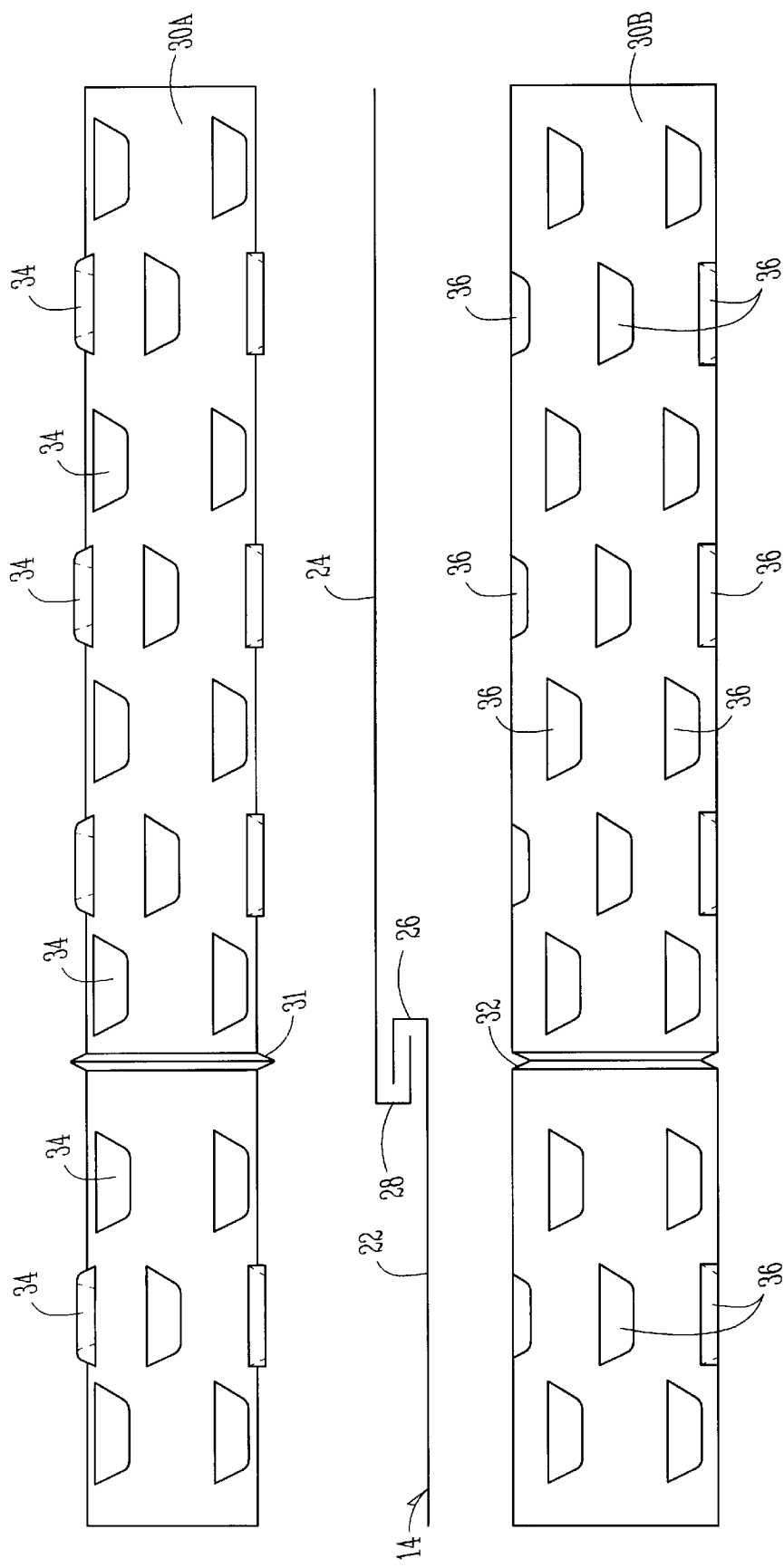

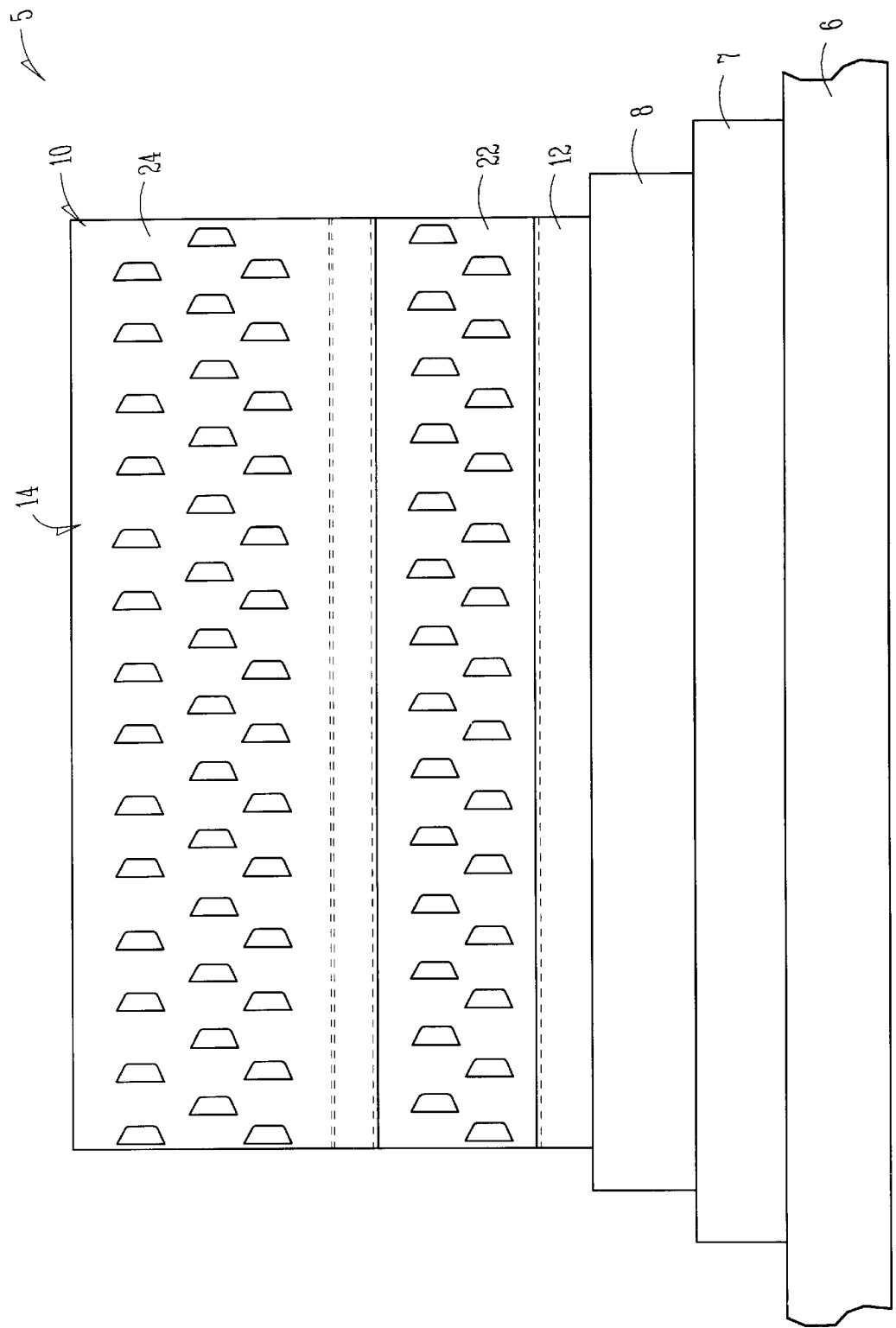

COMPOSITE FINS FOR HEAT SINKS

TECHNICAL FIELD OF THE INVENTION

The present invention relates generally to the field of electronic devices, and in particular to a composite fin for a heat sink that facilitates the thermal management of high-powered processors.

BACKGROUND

Electronic devices generate heat during operation. Thermal management refers to the ability to keep temperature-sensitive elements in an electronic device within a prescribed operating temperature. Thermal management has evolved to address the increased heat generation created within such electronic devices as a result of increased processing speed and power within the electronic devices.

Electronic devices were historically cooled by a natural convection thermal management technique. The cases or packaging of these prior art electronic devices were designed with openings (e.g., slots) strategically located to allow warm air to escape and cooler air to be drawn in.

The advent of high performance processors and electronic devices now requires more innovative thermal management. Each increase in processing speed and power generally carries a cost of increased heat generation such that natural convection alone is no longer sufficient to provide proper thermal management.

One common method for cooling electronic devices such as an integrated circuit that includes a high performance processor is by thermally coupling a heat sink to the processor. As used herein, processor means any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit. Processors typically require more innovative thermal management as compared to other types of integrated circuits because of their large size, high speed and high component count.

A heat sink is a thermal dissipation device comprised of a mass of material that is thermally coupled to a heat source to conduct thermal energy away from the heat source. The heat sink conducts the thermal energy away from a high-temperature region (i.e., the processor) to a low-temperature region (i.e., the heat sink). The thermal energy is then dissipated by convection and radiation from a surface of the heat sink into the atmosphere surrounding the heat sink.

A well-known technique of improving the efficiency of a conductive heat sink is to provide a greater surface area on the heat sink. The increased surface area is typically provided by a number of fins that are attached to a base portion of the heat sink. The fins allow the heat sink to dissipate a greater amount of thermal energy from the heat sink into the atmosphere.

The base of the heat sink device may have many different forms. The base typically includes one or more surfaces that are thermally coupled, directly or indirectly, to an integrated circuit that includes a processor in order to dissipate heat from the processor. Thermal energy is conducted from the processor through the heat sink base into the fins. The heat is dissipated into the atmosphere by convection through the top surface of base and the surface of fins.

The fins are either integral with the base of the heat sink or assembled to the base using various conventional fastening techniques. In heat sinks where the base and the fins are assembled together, the base is typically either copper or aluminum, and the fins are either copper or aluminum. Copper has superior thermal conductivity as compared to aluminum, but is significantly more expensive. Copper is also much denser, adding significant weight to the heat sink making the heat sink, and the electronic device where the heat sink is located, more vulnerable to damage from shock and/or vibration. Therefore, heat sinks that have copper are heavy and costly while aluminum fins do not provide enough thermal performance.

An alternative and more costly system to manage the thermal energy output of high-powered processors utilizes the heat sinks in combination with a fan. The fan forces air or some other fluid over and around the surface of the heat sink and/or processor in order to dissipate a greater amount of thermal energy from the processor.

There are several problems with cooling systems that include a heat sink and fan combination. One problem is that the fan must typically be located too closely to the fins of the heat sink to generate fully developed air flow. When a large fan is used in conjunction with a heat sink to cool an electronic component, a large percentage of the air moved by the system fan does not go through the heat sink. As a result, even large fans are not an efficient solution for cooling some electronic devices.

Some cooling systems utilize multiple fans to maintain proper operating temperatures. However, the additional fans add unwanted expense to manufacturing such electronic devices. In addition, extra fans are noisy, bulky and utilize an inordinate amount of space within the environment where the electronic device is located.

Since existing heat sinks do not cost-effectively cool high performance processors, what is needed is a cost-effective heat sink that provides high performance cooling for electronic components with high-power generation.

BRIEF DESCRIPTION OF THE DRAWINGS

FIG. 4 is a schematic view illustrating a method of assembling the fins that are used in the heat sink illustrated in FIGS. 1 and 2.

FIG. 5 is a schematic view illustrating a portion of a computer system that includes the heat sink illustrated in FIGS. 1 and 2.

DETAILED DESCRIPTION

Figure 1:
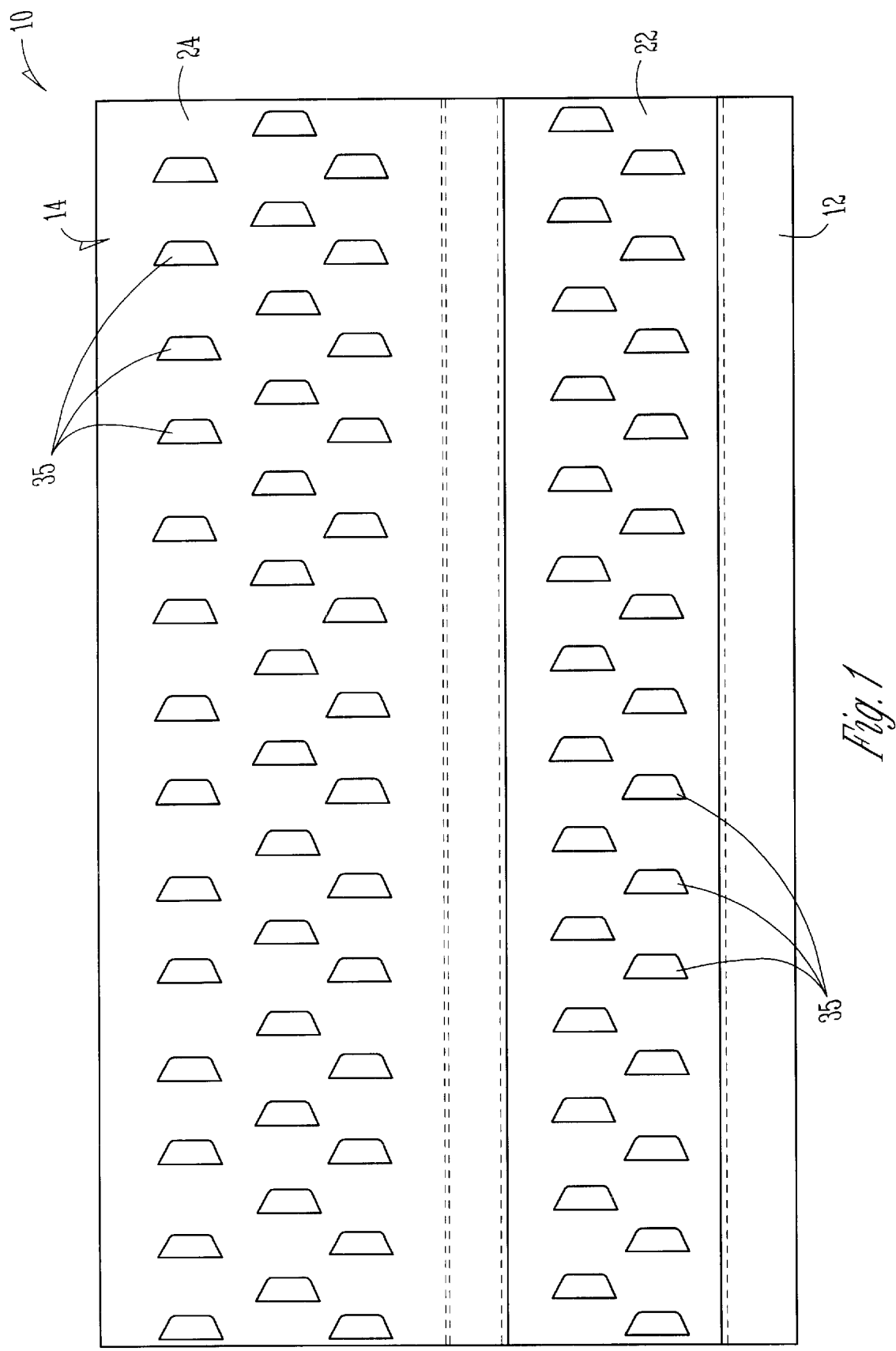
FIG. 1 is a front view illustrating a heat sink of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes may be made, without departing from the scope of the present invention.

A method and heat sink for dissipating heat from an electronic device is described. The method and apparatus are cost-effective yet efficiently dissipate the thermal energy that is generated by high performance processors and other integrated circuits.

Figure 2:
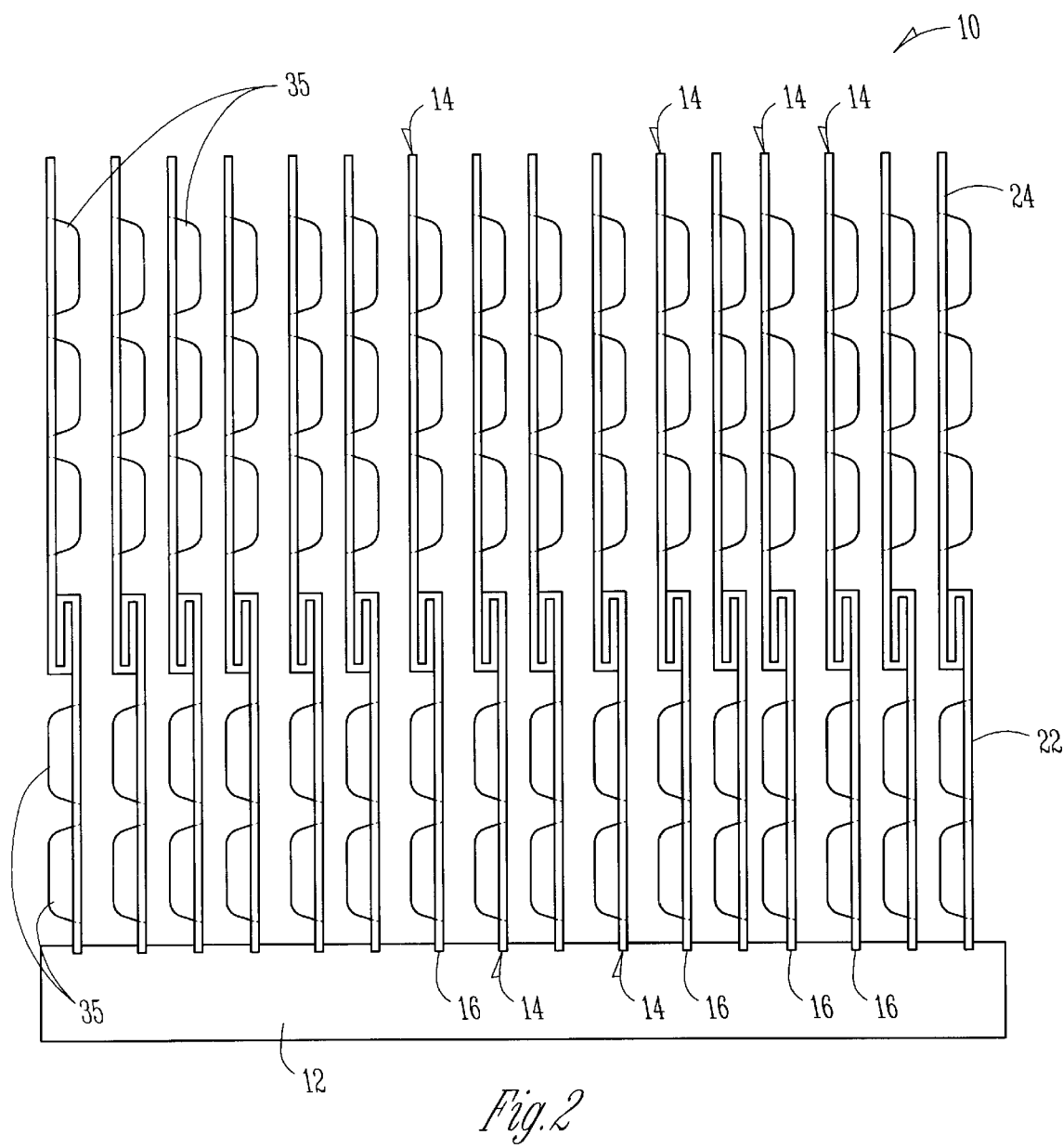
FIG. 2 is a side view of the heat sink illustrated in FIG. 1.

FIGS. 1 and 2 illustrate a heat sink 10 for dissipating heat from an electronic device. The heat sink 10 comprises a base 12 and plurality of fins 14. The base 12 is preferably made from copper and is adapted to be directly, or indirectly, thermally coupled to an integrated circuit (not shown) that includes a high-powered processor.

It should noted that even though FIGS. 1 and 2 show the fins 14 extending perpendicularly from the base 12, the fins 14 may be oriented at any angle relative to base 12 that facilitates conducting thermal energy from the base 12 into the atmosphere surrounding the heat sink 10. In addition, the number of fins 14 and the spacing of the fins 14 may vary to facilitate conduction of thermal energy away from the base 12.

Figure 3:
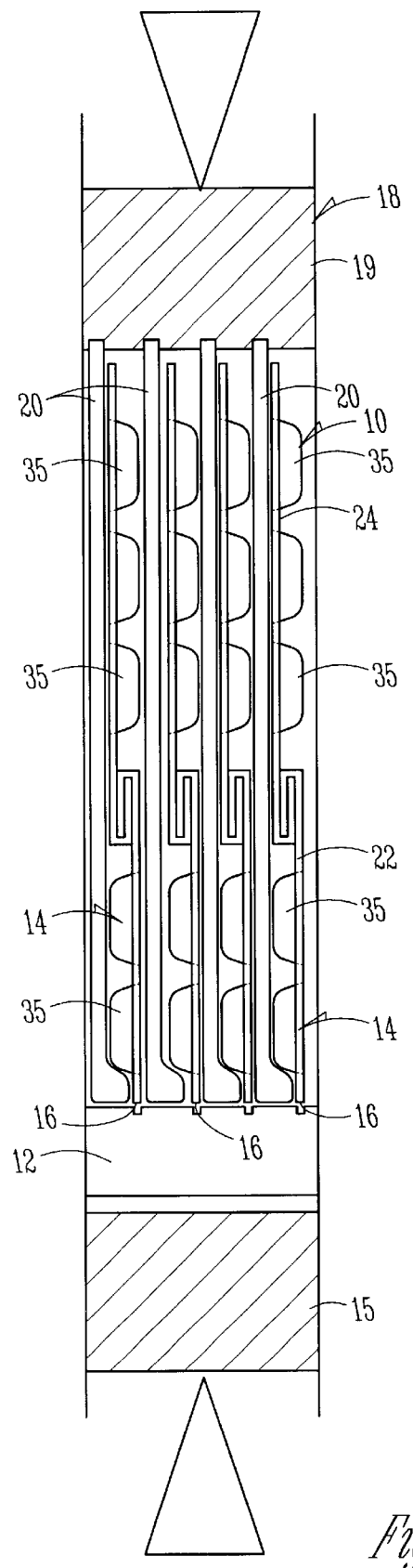
FIG. 3 is a side view illustrating a plurality of the fins being assembled to a base to form the heat sink illustrated in FIGS. 1 and 2.

FIG. 3 is a side view illustrating a plurality of the fins 14 being assembled to a base 12 to form the heat sink 10 illustrated in FIGS. 1 and 2. A bottom surface of the base 12 is supported by a stationary platen 15 while the lower edges 16 of the fins 14 are placed into grooves that are fabricated in an upper surface of the base 12. The fins 14 are secured to the base 12 place using a tool 18. The tool 18 includes a movable platen 19 that is moved toward the base 12 of the heat sink 10. The tool 18 further includes blades 20 that extend downward from the movable platen 19. The blades 20 engage the upper surface of the base 12 as the tool 18 is moved downward. As the tool 18 is moved further downward, a compressive force is generated between the blades 20 and the upper surface of the base 12 as indicated by the arrows in FIG. 3. The compressive force is great enough for the blades 20 to plastically deform the base 12 at locations adjacent to the fins 14 such that the blades 20 attach the fins 14 to the base 12. The fins 14 may also be attached to the base 12 using any other conventional attachment technique without departing from the scope of the present invention.

The fins 14 each include a copper portion 22 and an aluminum portion 24. The copper portion 22 has a higher thermal conductivity so it is placed into the base 12 to facilitate efficiently conducting thermal energy from the base. Since the copper portion is so dense and expensive, the remainder of the fin 14 is formed by the lightweight yet inexpensive aluminum portion 24.

Combining the copper portion 22 with the aluminum portion 24 produces a fin 14 that has thermal design advantages which are not available with monolithic aluminum fins and monolithic copper fins. The composite fins 14 have a higher thermal conductivity than aluminum fins and are lighter and less expensive than copper fins. Minimizing the weight of the fins 14 is important because of the damage that can result due to any shock and/or vibration which effects the heat sink 10 and/or the electronic device that includes the heat sink 10. It should be noted that one or more alternative materials may be combined to produce the fins 14 depending on the relevant heat transfer considerations and the costs that are associated with fabricating the heat sink 10 and the electronic device that includes the heat sink 10.

FIG. 4 is a schematic view illustrating a part of a method of assembling the fins 14 that are used to form the heat sink 10 illustrated in FIGS. 1 and 2. The copper portion 22 is initially in the form of a sheet that has one edge 26 roll-formed into a generally J-shape. The aluminum portion 24 is also initially in the form of a sheet and has an opposing edge 28 similarly roll-formed into a generally J-shape. The opposing edges 26, 28 on the copper and aluminum portions 22, 24 are interleaved to form a joint that connects the copper portion 22 to the aluminum portion 24.

The interleaved copper and aluminum portions 22, 24 are delivered through a pair of rolling tools 30A, 30B. The interleaved joint is delivered through the rolling tools 30A, 30B such that a crimping feature 31 on one of the rollers 30A plastically deforms the joint to crimp the copper portion 22 to the aluminum portion 24. The opposing roller 30B includes a corresponding detent 32 that is adapted to receive the crimping feature 31 on the other roller 30A. Although the crimping feature 31 and the detent 32 are shown with a generally V-shape, the crimping feature 31 and the detent 32 may have any shape that facilitates crimping the copper portion 22 to the aluminum portion 24. In addition, the crimping feature 31 and the detent 32 may not extend all of the way around the corresponding rollers 30A, 30B.

One of the rollers 30A may also include projections 34 that are used to form louvers 35 in one or both of the aluminum and copper portions 22, 24. The opposing roller 30B includes a number of recesses 36 that are adapted to receive a corresponding number of the projections 34 which extend from the other roller 30A. As shown in FIGS. 2 and 3, the louvers 35 preferably extend from one side of the fins 14 on the copper portion 22 and from the opposing side of the fins 14 on the aluminum portion 24. The louvers 35 may extend from one, or both, of the aluminum and copper portions 22, 24. It should also be noted that the louvers 35 may extend from one or both sides of the copper and aluminum portions 22, 24 that make up the fins 14 without departing from the scope of the present invention.

As shown in FIG. 5, a heat sink 10 according to any of the example embodiments described above may be incorporated into a computer system 5 that includes a chassis 6, an integrated circuit board 7 mounted in the chassis 6, and one or more processors 8 that are coupled to the integrated circuit board 7.

Another aspect of the present invention relates to method of assembling a heat sink 10. The method includes thermally coupling an aluminum portion 24 to a copper portion 22 in order to form a fin 14 and thermally coupling the fin 14 to a base 12 to form a heat sink 10. The heat sink 10 is thermally coupled to an integrated circuit (e.g., processor 8) such that the heat sink 10 conducts thermal energy away from the processor 8 during operation of the processor 8. The copper portion 22 of the fin 14 conducts thermal energy away from the base 12 to the aluminum portion 24 of the fin 14 to facilitate dissipating heat into the atmosphere surrounding the heat sink 10. One or more alternative materials may be combined to produce the fins 14 depending on the relevant heat transfer considerations and the costs that are associated with fabricating the heat sink 10.

Thermally coupling the copper portion 22 to the aluminum portion 24 to form a fin 14 may include forming interlocking shapes on opposing edges 26, 28 of the copper and aluminum portions 22, 24. The interlocking shapes on the opposing edges 26, 28 of the copper and aluminum portions 22, 24 are interleaved and then crimped together.

The method may further include forming louvers 35 on the copper and aluminum portions 22, 24 of the heat sink 10. The louvers 35 may be formed on one side, both sides, or a portion of any fin 14 that is used in the heat sink 10 without departing from the scope of the present invention.

Another embodiment of the present invention relates to a kit of parts for forming a heat sink 10 that is used to conduct thermal energy from an electronic device. The kit may comprise any combination of one or more (i) bases 12 that are adapted to be thermally coupled to the electronic device such that the base 12 conducts thermal energy away from the electronic device; (ii) copper portions 22 that are adapted to be thermally coupled to the base 12 such that the copper portions 22 conduct thermal energy away from the base 12; and (iii) aluminum portions 24 that are adapted to be thermally coupled to the copper portions 22 to form fins 14. The aluminum portion 24 of each fin 14 conducts thermal energy away from the copper portion 22 of each fin 14 when the assembled fin 14 is mounted to the base 12. Alternative materials may be used for the copper and aluminum portions 22, 24. The choice of materials will depend on the relevant heat transfer considerations and the costs that are associated with fabricating the heat sink 10 and the electronic device that includes the heat sink 10.

One of the advantages of assembling a heat sink 10 using a kit of parts as described herein is that the heat sink 10 can be assembled for use with a variety of industry standard integrated circuit boards from a single kit. The heat sink 10 is assembled by selecting the appropriate components based on the space available and the particular thermal situation. The kit also allows the heat sink 10 to be added after the chassis is assembled. The composite fins 14 may also be formed from portions that are made from materials other than copper and aluminum depending on the type of thermal environment.

The heat sink, kit and method described above provide a universally applied thermal solution for high heat generating electronic devices. The universal applicability provides thermal engineers with a multitude of options for cooling an electronic device such as a high-powered processor. Many other embodiments will be apparent to those of skill in the art from the above description. The scope of the invention should be determined with reference to the appended claims along with the full scope of equivalents to which such claims are entitled.

What is claimed is:

1. A heat sink for dissipating thermal energy from an electronic device, the heat sink comprising:
    a base thermally coupled to the electronic device;
    a fin thermally coupled to the base, the fin comprising a first portion made from a first material and a second portion made from a second material; and
    wherein at least one of the first and second portions includes louvers.

2. The heat sink of claim 1 wherein the first portion is coupled to the base and second portion is coupled to the first portion.

3. The heat sink of claim 1 wherein the first material is copper.

4. The heat sink of claim 3 wherein the second material is aluminum.

5. The heat sink of claim 4 wherein the base is made from copper.

6. The heat sink of claim 1 wherein thermal energy is conducted away from the base to the second portion of the fin through the first portion of the fin.

7. The heat sink of claim 1 further comprising at least one additional fin extending from the base.

8. The heat sink of claim 7 wherein each of the fins is parallel to each of the other fins.

9. The heat sink of claim 1 wherein the first portion includes louvers that extend from one side of the fin and the second portion includes louvers that extend from an opposing side of the fin.

10. A heat sink for dissipating thermal energy from an electronic device, the heat sink comprising:
    a copper base thermally coupled to the electronic device;
    a fin thermally coupled to the base, the fin comprising a copper portion and an aluminum portion such that the copper portion of the fin conducts thermal energy away from the copper base to the aluminum portion of the fin; and
    wherein at least one of the copper and aluminum portions includes louvers.

11. The heat sink of claim 10 wherein the copper portion includes louvers that extend from one side of the fin and the aluminum portion includes louvers that extend from an opposing side of the fin.

12. A method of assembling a heat sink, the method comprising:
    thermally coupling a first portion made from one material to a second portion made from a second material to form a fin, wherein thermally coupling a first portion to a second portion to form a fin includes crimping the first portion to the second portion;
    thermally coupling the fin to a base to form a heat sink; and
    thermally coupling the heat sink to an integrated circuit such that the heat sink conducts thermal energy away from the integrated circuit during operation of the integrated circuit.

13. The method of claim 12 wherein thermally coupling a first portion made from one material to a second portion made from a second material to form a fin includes thermally coupling a copper portion to an aluminum portion.

14. The method of claim 13 wherein thermally coupling the heat sink to an integrated circuit includes thermally coupling the base to the integrated circuit.

15. The method of claim 14 wherein crimping the first portion to the second portion to form the fin includes forming interlocking shapes on opposing edges of the first and second portions and then interleaving the opposing edges of the first and second portions.

16. A method of assembling a heat sink, the method comprising:
    thermally coupling a first portion made from one material to a second portion made from a second material to form a fin;
    thermally coupling the fin to a base to form a heat sink;
    thermally coupling the heat sink to an integrated circuit such that the heat sink conducts thermal energy away from the integrated circuit during operation of the integrated circuit; and
    forming louvers on the heat sink.

17. The method of claim 16 wherein forming louvers on the heat sink includes forming louvers on at least one of the first and second portions of the heat sink.

18. The method of claim 17 wherein forming louvers on the heat sink includes forming louvers on the first portion of the heat sink that extend from one side of the heat sink and forming louvers on the second portion of the heat sink that extend from an opposing side of the heat sink.

19. A kit of parts for forming a heat sink that is used to cool an electronic device, the kit comprising:
    a base adapted to be thermally coupled to the electronic device;
    a first portion adapted to by thermally coupled to the base;
    a second portion adapted to be thermally coupled to the first portion to form a fin, the second portion conducting thermal energy away from the first portion of the fin when the assembled fin is mounted to the base; and wherein at least one of the first and second portions of the kit includes louvers.

20. The kit of parts as claimed in claim 19 wherein the first portion of the fin is copper, the second portion of the fin is aluminum and the base is copper.

21. The kit of parts as claimed in claim 19 wherein the first portion includes louvers that extend from one side of the fin when the first portion is assembled to the second portion and the second portion includes louvers that extend from an opposing side of the fin when the first portion is assembled to the second portion.

22. The kit of parts as claimed in claim 21 the first portion includes louvers that extend from one side of the fin and the second portion includes louvers that extend from an opposing side of the fin when the first and second portions are assembled together to form the fin.

23. A computer system comprising:

a chassis;

an integrated circuit board mounted in the chassis;

a processor coupled to the integrated circuit board;

a heat sink thermally coupled to the processor, the heat sink comprising a base away from the processor, and a fin thermally coupled to the base, the fin comprising a first portion made from a first material and a second portion made from a second material; and wherein at least one of the first and second portions includes louvers.

24. The computer system of claim 23 wherein at least one of the first and second portions of the fin conducts thermal energy away from the base.

25. The computer system of claim 24 wherein the first material is copper, the second material is aluminum and the base is copper.

26. A heat sink for dissipating thermal energy from an electronic device, the heat sink comprising:

a base thermally coupled to the electronic device; and a fin thermally coupled to the base, the fin comprising a first portion made from a first material and a second portion made from a second material, the first portion including an edge that is joined with an opposing edge on the second portion to form the fin, wherein the edges of the first and second portions are J-shaped and interleaved to form a joint that connects the first portion and the second portion.

27. The heat sink of claim 26 wherein the edges of the first and second portions are interlocked to form a joint that connects the first portion and the second portion.

28. The heat sink of claim 26 wherein the edges of the first and second portions are crimped together.

29. A method of assembling a heat sink, the method comprising:

thermally coupling one edge of a first portion made from one material to an opposing edge of a second portion made from a second material to form a fin;

thermally coupling the fin to a base to form a heat sink; and thermally coupling the heat sink to an integrated circuit such that the heat sink conducts thermal energy away from the integrated circuit during operation of the integrated circuits wherein thermally coupling a first portion to a second portion to form a fin includes crimping the edge of the first portion to the opposing edge of the second portion.

30. The method of claim 29, wherein thermally coupling a first portion to a second portion to form a fin includes interleaving the edge of the first portion to the opposing edge of the second portion.

31. A method of assembling a heat sink, the method comprising:

thermally coupling one edge of a first portion made from one material to an opposing edge of a second portion made from a second material to form a fin;

thermally coupling the fin to a base to form a heat sink; and thermally coupling the heat sink to an integrated circuit such that the heat sink conducts thermal energy away from the integrated circuit during operation of the integrated circuit wherein thermally coupling one edge of a first portion made from one material to an opposing edge of a second portion made from a second material to form a fin includes interleaving J-shaped edges.

\* \* \* \* \*

UNITED STATES PATENT AND TRADEMARK OFFICE
CERTIFICATE OF CORRECTION

PATENT NO. : 6,636,423 B2
DATED : October 21, 2003
INVENTOR(S) : Agostino C. Rinella and Gregory M. Chrysler It is certified that error appears in the above-identified patent and that said Letters Patent is hereby corrected as shown below:

Title page, Item [54] and Column 1, line 1,
Title, delete "HEAT SINKS" and insert -- HEATSINKS -- therefor.

Column 6,
Line 36, delete "claim 14" and insert -- claim 12 -- therefor.

Signed and Sealed this

Twenty-eighth Day of December, 2004

JON W. DUDAS
*Director of the United States Patent and Trademark Office*